United States Patent
Brown et al.

(10) Patent No.: US 9,394,599 B2
(45) Date of Patent: Jul. 19, 2016

(54) CRYSTALLINE SURFACE STRUCTURES AND METHODS FOR THEIR FABRICATION

(75) Inventors: David P. Brown, Helsinki (FI); Jan Von Pfaler, Helsinki (FI)

(73) Assignee: Canatu Oy, Helsinki (FI)

( * ) Notice: Subject to any disclaimer, the term of this patent is extended or adjusted under 35 U.S.C. 154(b) by 142 days.

(21) Appl. No.: 13/130,023

(22) PCT Filed: Nov. 19, 2009

(86) PCT No.: PCT/FI2009/050939
§ 371 (c)(1),
(2), (4) Date: May 18, 2011

(87) PCT Pub. No.: WO2010/058083
PCT Pub. Date: May 27, 2010

(65) Prior Publication Data
US 2011/0223444 A1      Sep. 15, 2011

(30) Foreign Application Priority Data
Nov. 19, 2008    (FI) ....................................... 20086095

(51) Int. Cl.
*C01B 31/00* (2006.01)
*C23C 8/22* (2006.01)
(Continued)

(52) U.S. Cl.
CPC . *C23C 8/22* (2013.01); *B82Y 30/00* (2013.01); *B82Y 40/00* (2013.01); *C01B 31/0453* (2013.01); *C23C 8/00* (2013.01); *C23C 8/02* (2013.01); *C23C 8/08* (2013.01); *C23C 8/40* (2013.01); *C23C 8/80* (2013.01); *H01L 21/0254* (2013.01); *H01L 21/02439* (2013.01);
(Continued)

(58) Field of Classification Search
USPC .......................................................... 427/226
See application file for complete search history.

(56) References Cited

U.S. PATENT DOCUMENTS 4,013,487 A  *  3/1977  Ramqvist et al. ............. 148/220
4,358,046 A  *  11/1982  Detz et al. ..................... 228/176
(Continued)

FOREIGN PATENT DOCUMENTS

| | | |
|---|---|---|
| JP | 2004-003092 A | 1/2004 |
| JP | 2009-143799 A | 7/2009 |
| WO | 2009/129194 A2 | 10/2009 |

OTHER PUBLICATIONS

Yu et al., Graphene segregated on Ni surfaces and transferred to insulators, Appl. Phys. Letters 93, p. 113103 (2008).*
(Continued)

*Primary Examiner* — Robert Vetere
(74) *Attorney, Agent, or Firm* — Studebaker & Brackett PC

(57) ABSTRACT

A method for fabricating crystalline surface structures (4) on a template (1). The method comprises the steps of providing a template (1) into a reaction environment, wherein one or more elements (3) required for the formation of the crystalline surface structure (4) are contained within the template (1); heating the template (1) inside the reaction environment to increase the mobility of the element (3) within the template (1), and to increase the surface diffusion length of the element (3) on the template-environment interface; and activating the template (1) by altering the conditions within the reaction environment, to make the mobile element (3) slowly migrate towards the template-environment interface and to make the element (3) organize on the surface of the template (1) as a crystalline structure (4).

14 Claims, 5 Drawing Sheets

Figure 2A:
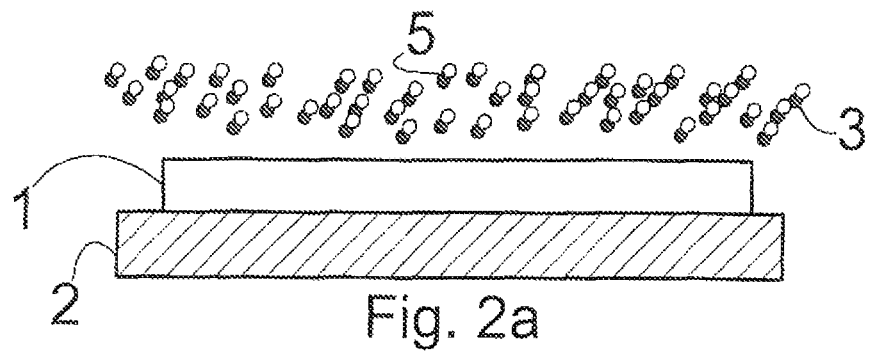

(51) Int. Cl.
| | |
|---|---|
| B82Y 30/00 | (2011.01) |
| B82Y 40/00 | (2011.01) |
| C01B 31/04 | (2006.01) |
| C23C 8/00 | (2006.01) |
| C23C 8/02 | (2006.01) |
| C23C 8/08 | (2006.01) |
| C23C 8/40 | (2006.01) |
| C23C 8/80 | (2006.01) |
| H01L 21/02 | (2006.01) |

(52) U.S. Cl.
CPC ... *H01L 21/02491* (2013.01); *H01L 21/02527* (2013.01); *H01L 21/02612* (2013.01); *H01L 21/02658* (2013.01); *C01B 2204/02* (2013.01); *C01B 2204/04* (2013.01); *C01B 2204/06* (2013.01)

(56) References Cited

U.S. PATENT DOCUMENTS

| | | |
|---|---|---|
| 2003/0129305 A1 | 7/2003 | Wu et al. |
| 2005/0271574 A1 | 12/2005 | Jang et al. |
| 2009/0155561 A1 | 6/2009 | Choi et al. |

OTHER PUBLICATIONS

Yu et al., "Graphene segregated on Ni surfaces and transferred to insulators," Appl. Phys. Letters, vol. 93, p. 113103, 2008.*

Marsh et al., "Catalysts of Graphitization", J. Appl. Chem., vol. 20, pp. 133-143, 1970.*

Derbyshire et al., "Graphite Formation by the Dissolution-Precipitation of Carbon in Cobalt, Nickel and Iron," 1975, Carbon 13, pp. 111-113.*

K.S. Novoselov et al.; "Electric Field Effect in Atomically Thin Carbon Films"; Science; vol. 366; No. 5696; pp. 666-669; Oct. 22, 2004.

An Office Action; "Notice of Reasons for Rejection," issued by the Japanese Patent Office on Sep. 9, 2014, which corresponds to Japanese Patent Application No. 2011-536915 and is related to U.S. Appl. No. 13/130,023; with English language translation.

Qingkai Yu et al.; "Graphene segregated on Ni surfaces and transferred to insulators"; Applied Physics Letters, 2008, vol. 93, pp. 113103/1-113103/3.

Y.Gamo et al.; "Atomic structure of monolayer graphite formed on Ni(111)"; Surface Science, 1997, vol. 374, pp. 61-64.

F.J. Derbyshire et al.; "Graphite Formation by the Dissolution-Precipitation of Carbon in Cobalt, Nickel and Iron"; Carbon, 1975, vol. 13, pp. 111-113.

C. Ducati et al.; "The role of the catalytic particle in the growth of carbon nanotubes by plasma enhanced chemical vapor deposition"; Journal of Applied Physics, 2004, vol. 95, No. 11, pp. 6387-6391.

R.T.K. Baker; "Nucleation and Growth of Carbon Deposits from the Nickel Catalyzed Decompistion of Acetylene"; Journal of Catalysis, 1972, vol. 26, pp. 51-62.

A.K. Geim; "The Rise of Graphene"; Manchester Centre of Mesoscience and Nanotechnology, University of Manchester, pp. 1-14.

P.S. Harris; "The Formation of Carbon Deposits from Decomposition fo Acetone over Nickel"; Applied Chemistry Division, Atomic Energy Research Establishment, Apr. 1973, pp. 531-539.

International Search Report; PCT/FI2009/050939; Feb. 23, 2010.

J.Paivasaari; Office Action Search Report; FI 20086095; Aug. 18, 2009.

* cited by examiner

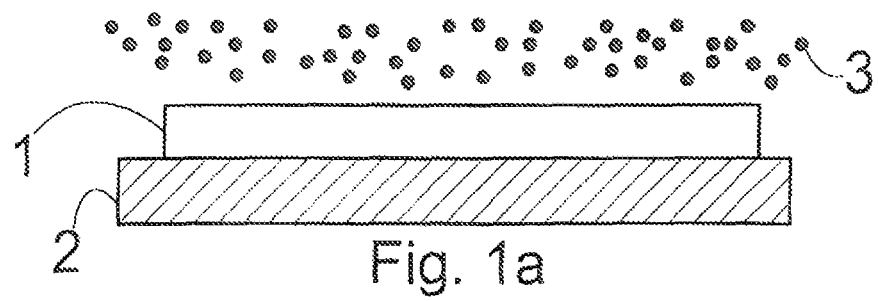
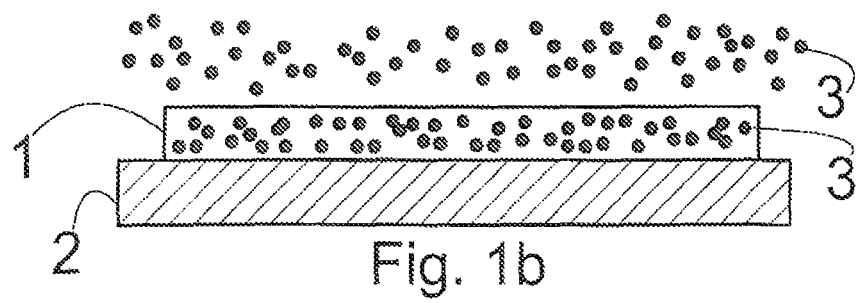
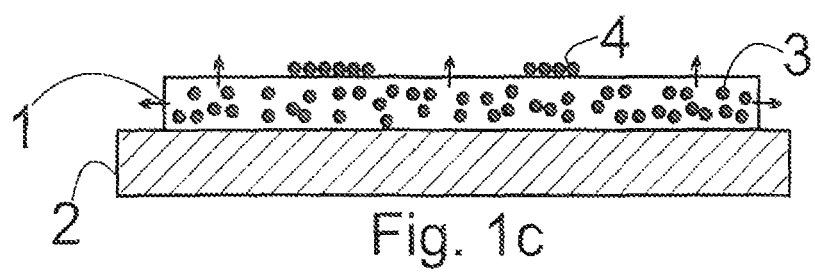
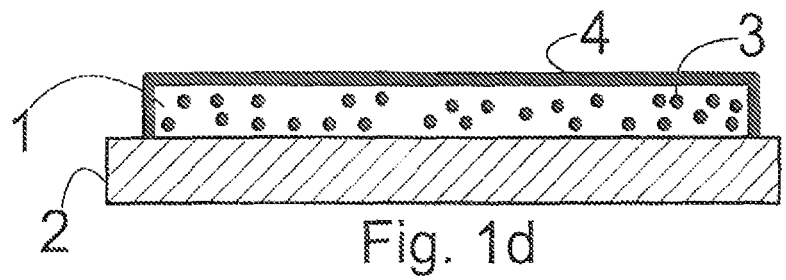
Fig. 1a
Fig. 1b
Fig. 1c
Fig. 1d

CRYSTALLINE SURFACE STRUCTURES AND METHODS FOR THEIR FABRICATION

FIELD OF THE INVENTION

The present invention relates to film growth technology. Specifically the present invention relates crystalline surface structures and to methods for fabricating crystalline structures on the surface of a template.

BACKGROUND OF THE INVENTION

Examples of so called monolayer crystalline surface (MCS) structures include essentially two-dimensional lattices of carbon (e.g. graphene), nitrogen and boron. When many parallel monolayers are present, such structures constitute a bulk material (as opposed to a film). Layered structures of 1 to 10 layers of essentially coplanar MCS-structures can be termed as few-layered crystalline surface (FCS) structures and they can still be termed films. Bulk or many-layered material containing tens of layers of essentially coplanar FCS-structures, when containing carbon, are termed graphite. FCS-structures can be distinguished from bulk also in that quantum effects are still important when the number of layers is small.

Graphene-based components have wide ranging applications for example in conductive pathways, transistors and sensors. FCS-structures are of great interest due to their unique and useful physical and chemical properties. FCS-structures in, for instance, polymers allow for the creation of flexible and transparent electronic devices.

Ideally, even an individual ribbon of an FCS-structure (containing one or a few monolayers) with a well defined property and in a specific location is sufficient for many applications. An example of such a structure is a Graphene Nano Ribbon (GNR). When these structures are narrow (on the order of a few nanometers wide) or thin (on the order of a few atomic layers thick) they exhibit quantum effects useful for many applications.

The high conductivity of certain FCS-structures, such as graphene, together with the ability to form these structures into 2D structures having extremely high aspect ratios, e.g. into graphene (carbon) nano-ribbons, allow for the production of high performance electronic components. The FCS-structures or the high aspect ratio structures fabricated from them may be utilized, for instance, as the conductive or semi-conductive channel of a transistor or sensor, or as a conductive element in a transparent electrode.

Graphene and carbon nano-ribbon based devices have already been successfully used as gas detectors, transistors, and transparent conductive coatings. Also, they are considered to be strong candidates for the replacement of ITO in transparent electrodes where the high costs of raw materials and production processes, together with performance barriers related to brittleness and coloring, are limiting their commercial lifetime.

For many purposes, the controlled synthesis of FCS-structures wherein the geometry and/or the location of the FCS-structure can be controlled is required. Moreover, FCS-structures already integrated on a substrate can be easier to manipulate, to assemble and to integrate into devices than randomly produced "stand-alone" fragments e.g. in a solution. Moreover, free fragments tend to fold or roll-up, thus reducing or negating many of their useful properties.

To date, manufacturing of FCS-structures in general and of devices based on individual FCS-structures has been too difficult, time-consuming and expensive to be commercially viable. For instance, in the case of graphene, only physical or chemical exfoliation from graphite has been shown to produce carbon MCS-structures (graphene). An example of an exfoliation method is disclosed in "Novoselov K. S., Electric Field Effect in Atomically Thin Carbon Films, Science, Vol. 306, no. 5696, pp. 666-669, 2004". The drawbacks of such methods include e.g. lack of control of the end-product in terms of both quality and location, and a typically random and fragmented distribution of the MCS sheets on a substrate or in a solution. The problems associated with the prior art methods, the difficulty in producing consistent product, controlling the location of the product on substrates and patterning the product, together lead to complex and expensive manufacturing processes.

PURPOSE OF THE INVENTION

The purpose of the present invention is to reduce the aforementioned technical problems of the prior-art by providing a new type of method for fabricating crystalline surface structures, especially few-layered crystalline surface structures (FCS-structures) on a template.

SUMMARY OF THE INVENTION

The method according to the present invention is characterized by what is presented in claim 1.

The product according to the present invention is characterized by what is presented in claim 12.

The use according to the present invention is characterized by what is presented in claim 13.

A method according to the present invention, for fabricating crystalline surface structures on a template, comprises the steps of providing a template into a reaction environment, wherein one or more elements required for the formation of the crystalline surface structure are contained within the template, heating the template inside the reaction environment to increase the mobility of the element within the template, and to increase the surface diffusion length of the element on the template-environment interface, and activating the template by altering the conditions within the reaction environment, to make the mobile element slowly migrate towards the template-environment interface and to make the element organize on the surface of the template as a crystalline structure. Furthermore, the crystalline structure is a monolayer crystalline surface (MCS) structure or a few-layered crystalline surface (FCS) structure.

A crystalline surface structure according to the present invention is fabricated by a method according to the present invention.

According to the present invention a method according to the present invention is used in the fabrication of a product.

According to one embodiment of the present invention, activating the template by altering the conditions within the reaction environment comprises releasing the element from the bulk of the template by a chemical reaction and/or by supersaturation of the template.

According to one embodiment of the present invention, activating the template by altering the conditions within the reaction environment comprises altering the temperature of the template and/or altering the partial pressure of the element in the reaction environment.

A few-layered crystalline structure (FCS) is a structure in which individual atomic layers are not covalently bonded to each other but are able to glide in plane with respect to each other.

Heating the template containing one, some or all of the elements required for the formation of the crystalline surface structure over the template, increases the mobility of the atoms or molecules of these elements both inside the template and at the template-environment interface. When the conditions of the template and/or of the reaction environment holding the template are suitably altered, at least a fraction of the elements migrate from inside the template onto the template-environment interface. Ensuring that the migration rate is sufficiently low and that the surface diffusion length of the element(s) on the surface of the template is sufficiently high, the atoms of the migrated elements will have sufficiently high mobility on the surface of the template to nucleate on an energy minimum. The surface diffusion length of the element(s) on the surface of the template can be controlled by controlling the temperature of the template and the pressure of the reaction environment. These parameters have to be adjusted so that the surface diffusion length is high enough to enable two-dimensional crystalline growth, at the same time ensuring that the elements do not become volatile on the surface of the template. As some materials possess a local energy minimum in a two dimensional configuration, a method according to the present invention may be used to produce crystalline surface structures with even a monolayer thickness, i.e. MCS (Monolayer Crystalline Surface)-structures.

A method according to the present invention provides a simple way to easily and efficiently synthesize FCS-structures on metal, insulator, polymer or other useful substrates, without the need for unreliable exfoliation techniques which furthermore are difficult to control. The method enables the production of a non-fragmented continuous crystalline surface structure on the surface of a template. The resulting structure commonly conforms to the shape of the template. Thus, by using a template of a suitable shape with a long or virtually infinite radius of curvature, essentially planar sheets of crystalline material may be produced on the template. The template may be e.g. solid, vitreous or liquid material.

According to one embodiment of the present invention, the method comprises the step of impregnating a heated template by the element by introducing the element into the reaction environment in a gas or in a liquid flow over the template, and by letting the element diffuse into the heated template.

According to one embodiment of the present invention, impregnating the heated template comprises introducing the element into the reaction environment as part of one or more precursors which thermally or chemically decompose inside the reaction environment to release the element to be diffused inside the template.

According to one embodiment of the present invention, impregnating the heated template comprises introducing carbon monoxide (CO) precursor into the reaction environment into contact with the template, for making carbon diffuse into the template.

The impregnation of the template may be simply carried out by placing the template in a reaction environment, and by exposing the template to a gaseous composition incorporating the element with which the template is to be impregnated. The one or more elements in the gaseous composition may be in elemental form or as part of precursor molecules.

According to one embodiment of the present invention, the element is selected from the group of carbon, nitrogen and boron.

According to one embodiment of the present invention, the crystalline surface structure is graphene.

Carbon, nitrogen and boron are elements that are known to possess crystalline structures which have a local energy minimum in a two dimensional configuration. Carbon, nitrogen and boron are therefore suitable materials for FCS-structures obtainable with a method according to the present invention. Specifically graphene, possessing interesting electrical, chemical and mechanical properties may be fabricated by using carbon monoxide (CO) as a precursor for impregnating the template with carbon. The carbon may be made to migrate onto the surface of the template from inside the template in a method according to one embodiment of the present invention. On the surface of the template the carbon atoms may self organize as graphene by surface diffusion, to minimize the energy of the crystalline lattice.

According to one embodiment of the present invention, the material of the template comprises transition metal, oxide, nitride or carbide. These template materials are suitable for impregnation with carbon, nitrogen or boron, as the diffusion rate of these elements into (and migration rate out of) the aforementioned template materials, is inherently relatively quick even at low template temperatures and at small concentration differences between the template and its environment. The inherently high rate of diffusion and migration enables to more efficiently control these processes by external process parameters, which is beneficial for homogeneous impregnation of the template and for reliable fabrication of an FCS-structure onto the surface of the template.

According to one embodiment of the present invention, the method comprises the step of positioning the template on a substrate. The substrate is commonly solid or vitreous.

According to one embodiment of the present invention, the template is liquid whose surface tension and wetting angle on the substrate are small enough that the liquid template forms a continuous film over the substrate.

When the template material is in liquid phase (or becomes liquid during a method according to the present invention), a substrate may be needed to mechanically support the template. Use of a liquid template material may be beneficial e.g. due to inherently more rapid migration and diffusion processes compared to solid templates, which enables to more efficiently control the migration and diffusion processes by external process parameters. Such process parameters include the temperature, the pressure and/or the chemical composition of the reaction environment.

A further advantage of the present invention is that it provides a method for fabricating crystalline structures, specifically FCS-structures, on a template from which the FCS-structures can be easily transferred onto secondary, e.g. polymer, substrates or integrated into electronic devices. By impregnating the template with different elements the resulting FCS-structures can be fabricated in different compositions comprising these different elements. The method according to the present invention allows for simpler, cheaper and more versatile method for fabricating FCS-structures than prior art techniques, thus allowing reduced cost and better performance.

The invention is particularly useful in, for example, the manufacturing of homogeneous or patterned transparent, conductive, and flexible polymer films comprising graphene or other FCS-structures. The invention may also be used in the fabrication of e.g. coated and multi-layered or three-dimensional structures, which are suitable for many optical and electronic applications such as opaque or transparent electrodes, interconnects, transistors, memory elements, diodes, lasers, filters, optical absorbers, saturable absorbers, field emitters, photo receptors, logic gates, inverters, probes; electrochemical devices such as supercapacitors, hydrogen storage (e.g. in fuel cells); analytical applications such as gas sensors, electrode materials and/or modifiers for analytical voltammetry, biosensors; chromatographic applications; mechanical applications such as conducting composites for antistatic shielding, transparent conductors for shielding of electromagnetic interference; electron guns for microscopes, field emission cathodes in, for instance, microwave amplifiers and/or field emission displays, gas storage, field-effect transistors, nanoribbon electromechanical actuators, electrodes in lithium batteries, light sources, saturable absorbers, nanosensors, solar cells, fuel cells, ultracapacitors and/or thermionic power supplies.

The embodiments of the invention described hereinbefore may be used in any combination with each other. Several of the embodiments may be combined together to form a further embodiment of the invention. A method, a product or a use to which the invention is related, may comprise at least one of the embodiments of the invention described hereinbefore.

DETAILED DESCRIPTION OF THE INVENTION

Figure 2B:
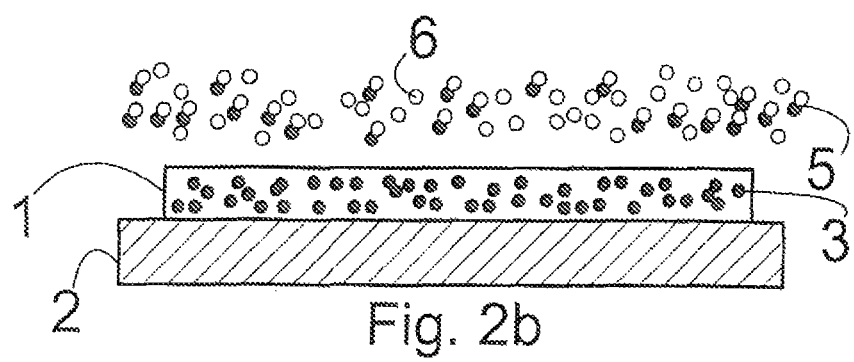
Figure 2C:
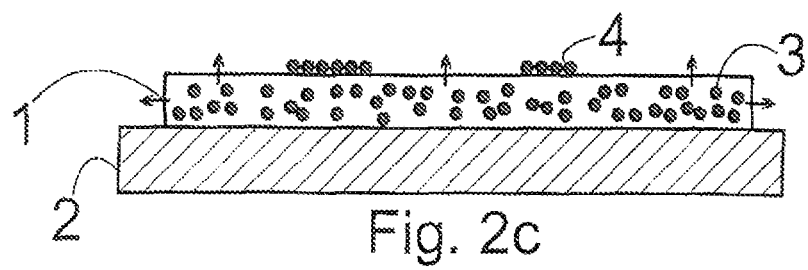
Figure 2D:
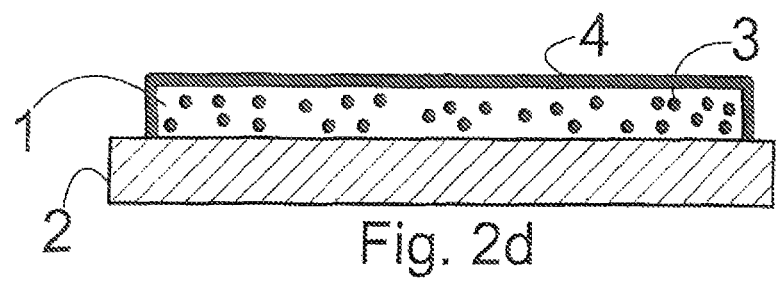
Figure 3A:
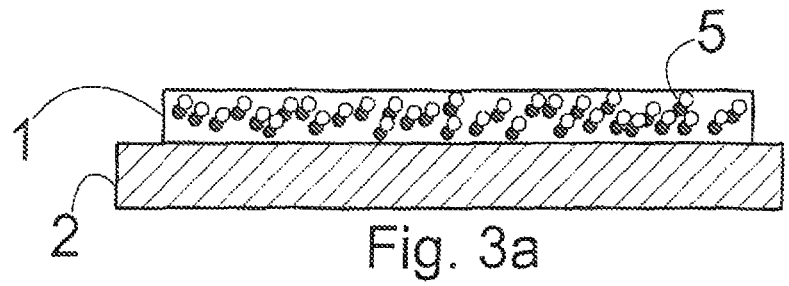
Figure 3B:
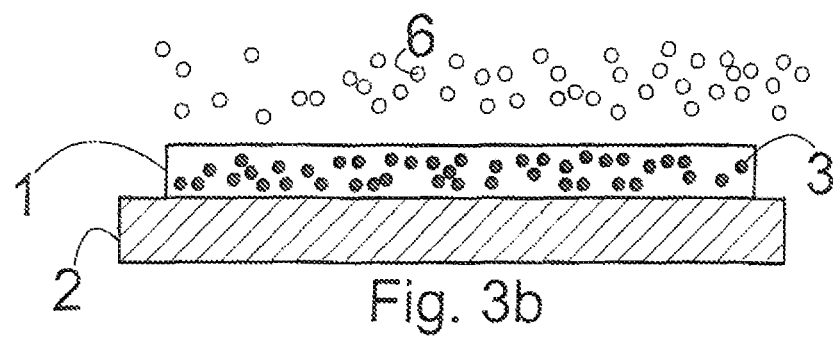
Figure 3C:
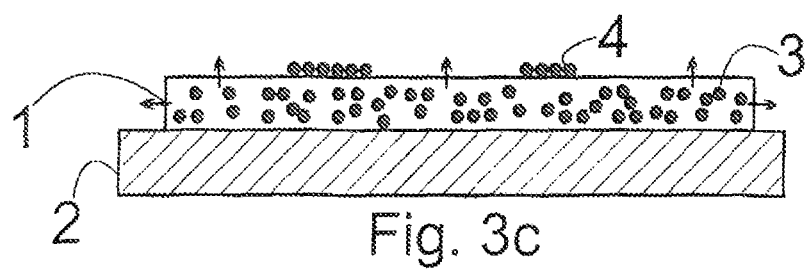
Figure 3D:
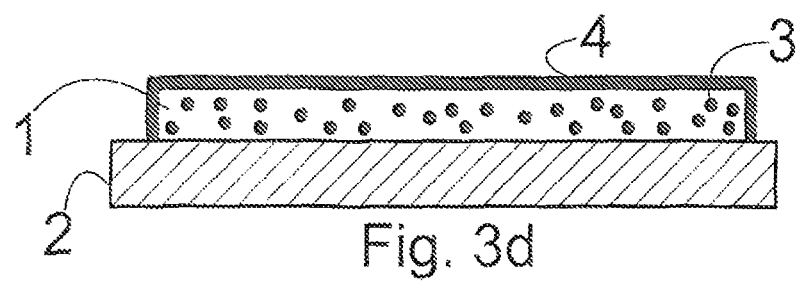
Figure 4:
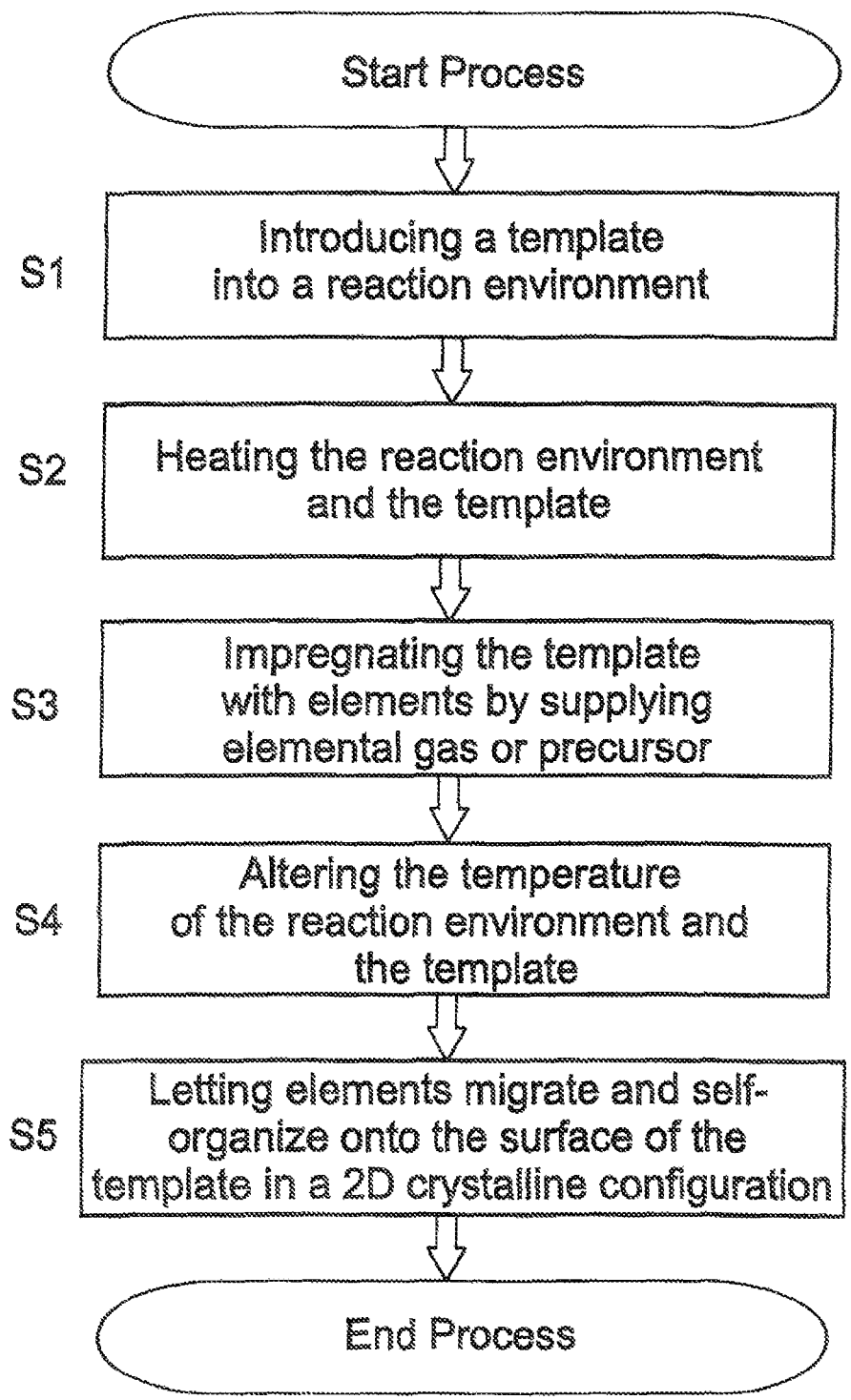
Figure 5:
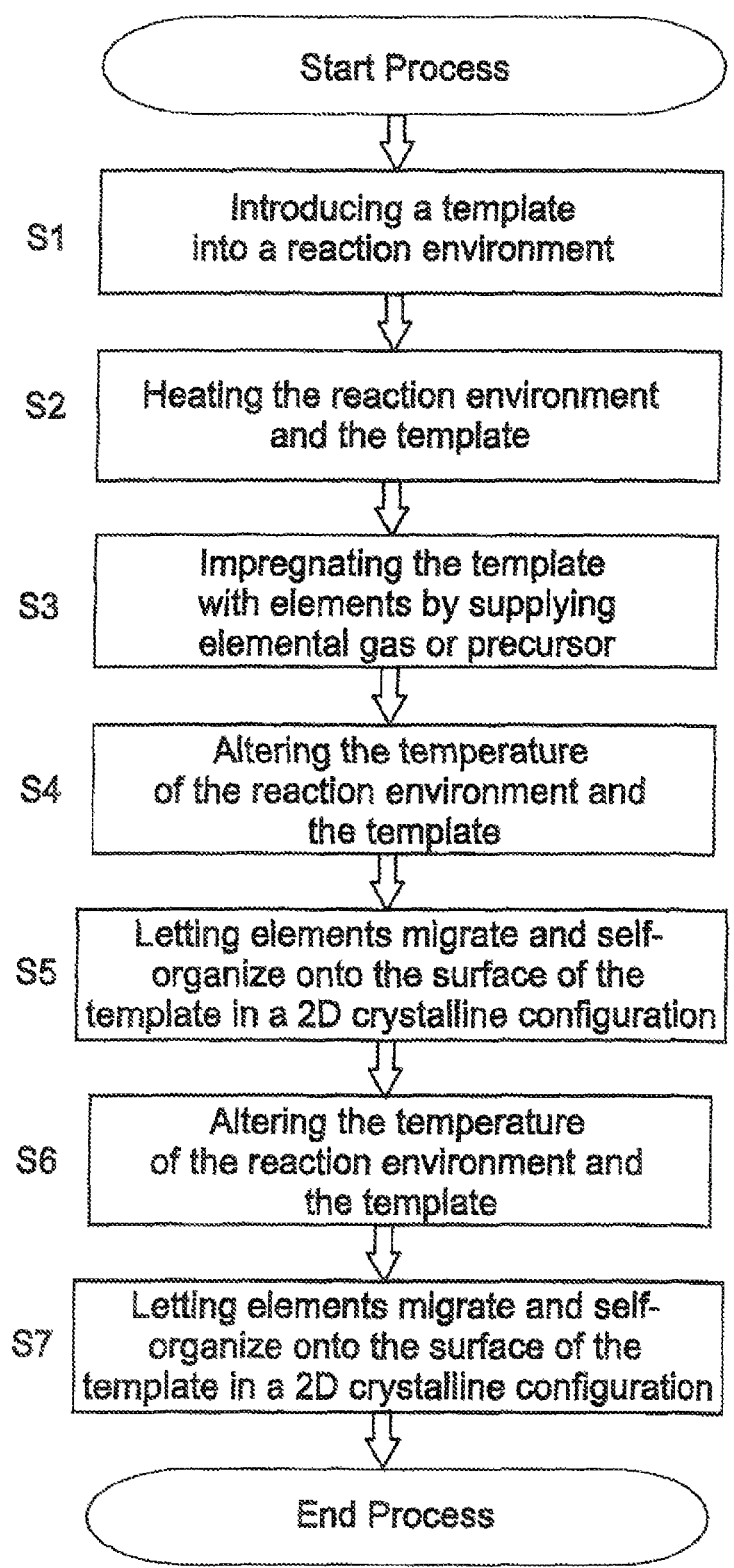

In the following, the present invention will be described in more detail with exemplary embodiments by referring to the accompanying figures, in which FIGS. 1a-1d are a series of figures schematically illustrating a method according to one embodiment of the present invention, FIGS. 2a-2d are a series of figures schematically illustrating a method according to one embodiment of the present invention, FIGS. 3a-3d are a series of figures schematically illustrating a method according to one embodiment of the present invention, FIG. 4 is a flow-chart presentation of methods according to some embodiments of the present invention and FIG. 5 is a flow-chart presentation of methods according to some embodiments of the present invention.

For reasons of simplicity, item numbers will be maintained in the following exemplary embodiments in the case of repeating components.

The flow-chart of FIG. 4 presents in more detail the process steps of the embodiments of the invention presented by the series of FIGS. 1a-1d and of FIGS. 2a-2d.

FIGS. 1a to 1d schematically illustrate a fabrication process of a crystalline structure according to one embodiment of the present invention. Each figure presents a schematic cross sectional view of the template 1 and the substrate 2 supporting the template 1, in one step of the manufacturing process. The order of the figures corresponds to the order of the process steps in the manufacturing process.

The first step S1 in the embodiment shown by FIGS. 1a to 1d is to introduce a template 1 into a reaction environment. The reaction environment may possibly be also pumped into vacuum. After this, in step S2, the reaction environment is heated to a suitable process temperature, which also heats the template 1 and a supporting substrate 2. The template 1, placed in the reaction environment, is impregnated with one or more elements 3 in step S3. These elements 3 will constitute the crystalline structure 4 on the template at a later stage of the method. During this step S3, illustrated by FIG. 1a, the template 1 is heated and exposed to the molecules or atoms of the element(s) 3. The impregnation may be carried out by e.g. supplying the elements 3 in a gas flow in the reaction environment. Heating the template 1 increases the rate of diffusion of the elements 3 from the gas phase into the template 1 (FIG. 1b). The template 1 in FIGS. 1a-1d is supported by a solid substrate 2 and the template 1 may be homogeneous or patterned.

As the template 1 is exposed sufficiently long to the gas-phase elements 3, the template 1 may become saturated from the elements 3 at which point no more net diffusion of the elements 3 into the template 1 occurs. After the template 1 has been impregnated (FIG. 1b), conditions in the reaction environment are altered (step S4) such that the elements 3 inside the template 1 begin to migrate onto the surface of the template 1 (FIG. 1c), i.e. the template 1 is "activated". Suitable alterations in the conditions inside the reaction environment for the migration to take place include e.g. a decrease in the temperature of the template 1 causing supersaturation of the template 1 by the elements 3, a decrease in the partial pressure of an element 3 in the reaction environment, or an increase in the temperature of the template 1 causing a thermally assisted chemical reaction to take place inside the template 1. This chemical reaction may lead to segregation of the template 1 material releasing elements 3 from within the template 1. It has surprisingly been observed that when the rate of migration is sufficiently small and the surface mobility of the elements 3 on the template 1 is sufficiently high the elements 3 prefer to self-organize in a two-dimensional crystalline surface structure 4 conforming to the shape of the template 1 (step S5 and FIG. 1d). This occurs on the condition that the particular formed crystalline structure 4 has a local energy minimum in a two-dimensional configuration.

As the crystalline surface structure 4 conforms to the shape of the template 1 the aforementioned mechanism for the synthesis of a crystalline surface structure 4 enables controlling the size and shape of the resulting crystalline surface structure 4 by controlling the size and shape of the surface area of the template 1. Additionally the disclosed method is particularly suitable for the fabrication of FCS-structures due to the fact that growth of the structure 4 takes place from within the template as opposed to conventional, possibly epitaxial, film deposition methods (e.g. CVD, MOCVD, sputtering, PVD etc.) in which a structure is synthesized on a substrate from the side of the environment, i.e. the structure is deposited on the substrate. By letting the elements 3 migrate onto the surface of the template 1 from within the template 1, the formed crystalline structure 4 itself efficiently acts as a migration barrier against the elements 3. This prevents buildup of the elements 3 onto the already formed crystalline surface structure 4, which causes the thickness of the crystalline surface structure 4 to remain small, preferring a two-dimensional structure 4. By suitably choosing the elements 3, e.g. from the group of carbon, nitrogen and/or boron, such that the elements 3 are known to form crystalline structures 4 that have a local energy minimum in a two-dimensional configuration, MSC-structures of these elements 3 can be easily synthesized with the disclosed method.

FIGS. 2a to 2d schematically illustrate a fabrication process of a crystalline structure according to one embodiment of the present invention. Each figure presents a schematic cross sectional view of the template 1 and the substrate 2 supporting the template 1, in one step of the manufacturing process. The order of the figures corresponds to the order of the process steps in the manufacturing process. The method schematically illustrated by FIGS. 2a-2d is different from the one illustrate by FIGS. 1a-1d in that an element 3 is supplied into the reaction environment as part of a precursor molecule 5 in step S3 (FIG. 2a). The precursor 5 contains element 3 of the material of the crystalline surface structure 4, for instance in liquid or gaseous state. Conditions in the reaction environment can be adjusted so that the precursor 5 reacts and/or decomposes in contact with the surface of the template 1 to release the element 3 at the interface between the reaction environment and the surface of the template 1. When the precursor molecules 5 reach the heated reaction environment and decompose, the precursor molecules 5 release the element 3 that diffuses into the template 1 and impregnates it (FIG. 2b). The template 1 may catalytically participate in the decomposition of the precursor 5. The remaining part 6 of the precursor 5 molecule gets flushed away from the reaction environment through an output path. When e.g. the temperature of the reaction environment and the template 1 is subsequently altered (decreased or increased depending on whether a supersaturation or a chemical reaction possibly leading to segregation is targeted within the template 1, respectively) in step S4 the element 3 remaining inside the template starts to migrate towards the surface of the template (FIG. 2c) forming a crystalline surface structure 4 (step S5, FIG. 2d), e.g. an FCS-structure, as discussed above.

FIGS. 3a to 3d schematically illustrate another fabrication process of a crystalline structure according to one embodiment of the present invention. Each figure presents a schematic cross sectional view of the template 1 and the substrate 2 supporting the template 1, in one step of the manufacturing process. The order of the figures corresponds to the order of the process steps in the manufacturing process. In the FIGS. 3a-3d the template 1 is already impregnated with precursor molecules 5 upon insertion to the reaction environment (FIG. 3a). The precursor molecules 5 in this embodiment may be understood as structural entitles inside the template 1 that comprise other molecules bonded to the elements 3. When the reaction environment and the template 1 are heated the remaining part 6 of the precursor molecules 5 is released from the template 1 into the reaction environment leaving the elements 3 inside the template 1 (FIG. 3b). When the temperature of the reaction environment and the template 1 is subsequently decreased the elements 3 remaining inside the template start to migrate towards the surface of the template (FIG. 3c) forming a crystalline surface structure, e.g. an FCS-structure, as discussed above (FIG. 3d).

In one embodiment of the invention fabrication of crystalline surface structures 4 thicker than one monolayer may be realized by staging the activation of the template 1. In this embodiment e.g. multi-layered FCS-structures may be fabricated by causing a staged transport of the one or more elements 3 to the surface of the template 1. For example, the temperature of an impregnated template 1 or the partial pressure of an element 3 in the reaction environment can be dropped in discrete steps, after each of which the template 1 becomes supersaturated and produces a single layer of FCS-structure on the template 1; once a layer is formed, the temperature is dropped again to form an additional atomic layer. This additional layer is formed in between the previously formed layer and the template 1, the new layer causing the previous layer to move away from the surface of the template 1. The staging can be continued until a desired number of layers is obtained, the template 1 is exhausted of an element 3, or the mobility of an element 3 is too low to self-organize into additional FCS-structures on the template 1. The flow chart of FIG. 5 illustrates an embodiment of the method where staging is used to fabricate two layers of FCS-structures. The method of FIG. 5 is identical to the method of FIG. 4 with the only difference being that steps S4 and S5 are respectively repeated in steps S6 and S7 to realize the staging.

In one embodiment of the invention the reaction environment may be e.g. a chamber comprising an input path for introducing the elements 3 or precursors 5 from their sources in a gas flow and onto the template 1, and an output path connected to a vacuum pump for guiding the exhaust gases out of the reaction environment. The temperature, pressure and chemical composition of the reaction environment may be controlled by heaters, by the pumping speed of the pump, and by feeding of the elements 3 and/or other gases into the reaction environment.

The template 1 can be fabricated on a substrate 2 in many ways. It may be obtained e.g. as a part of a method according to an embodiment of the present invention, or the template 1 on the substrate 2 can alternatively be fabricated in advance as a step separate from the invention. A suitable template 1 can then be chosen for a specific application.

The template 1 can be formed e.g. by depositing the template material on the substrate 2. The deposition can be performed, for example, by sputtering, by chemical vapor deposition (CVD) or by condensation. After deposition the template 1 may be patterned into a desired shape by common film patterning techniques such as chemical etching or laser patterning.

If required for some applications, the crystalline surface structure 4, e.g. an FCS-structure, can be transferred to another substrate (a transfer substrate). To accomplish this, the template 1, having a crystalline surface structure 4 grown on the interface of the reaction environment and the template 1, is placed in close proximity to, or in contact with, a suitable transfer substrate. The initially obtained crystalline surface structure 4 can be homogeneous or inhomogeneous. It can e.g. be patterned, aligned and/or oriented and/or be of varying composition.

EXAMPLES

Example 1 pertains to graphene nanoribbons synthesized from a gaseous carbon precursor on an iron template 1, according to one embodiment of the invention. In this example, iron is deposited on a substrate 2 by, for instance, sputtering in the desired pattern, for instance in a ribbon. The iron deposit template 1 on the substrate 2 is then placed in a reaction environment into which a gaseous carbon source, CO precursor in this case (an organic precursor or a hydrocarbon, such as alcohol vapor or methane are also suitable), is introduced. The conditions in the reaction environment are then modified by elevating the temperature such that the carbon element 3 from the carbon precursor is released from the precursor 5 and diffuses into the iron ribbon template 1 for a period of time, such that the template 1 becomes saturated with carbon. The carbon (the element 3) can be released in the gas phase and then diffuse or migrate into the iron deposit as would be the case for, for instance, methane. The carbon can also be released directly into the iron template 1 due to a catalytic decomposition of the precursor 5 at the surface of the iron template 1, as is the case with, for instance, a CO precursor 5. The iron template 1 can be saturated by a continued introduction of carbon. By changing a process parameter, such as lowering the temperature in the reaction environment which also lowers the temperature of the iron template 1, supersaturation of the template 1 from the carbon element 3 is achieved. Once supersaturation occurs, the carbon migrates to the surface and begins to self organize in a complete or partial graphene layer 4 with the geometrical bounds of the iron template 1 thereby determining the geometrical bounds of the graphene layer 4.

According to example 1 an FCS-structure 4 was produced by preparing an iron template 1 material approximately 10 microns wide, approximately 100 microns long and approximately 1 micron thick on a silicon or silica substrate 2 by traditional sputtering and lift-off techniques. The iron template 1 was then placed in a tubular furnace held at approximately 800° C. into which CO was introduced at a pressure of approximately 1 atm with a flow rate of CO of approximately of 0.1 liters per minute. The iron template 1 was held in the reaction environment (the tubular furnace) for approximately 10 minutes at the furnace temperature. The iron template 1 was then slowly cooled down by gradually withdrawing it from the heated zone or cooling the heated zone of the reactor so that the temperature of the template 1 dropped at a rate of approximately 1° C./sec until the substrate 2 was cooled down to approximately 25° C. During the cooling process an FCS-structure 4 conforming to the shape of the template 1 formed at the template-environment interface.

Also according to example 1, an FCS-structure 4 was produced by preparing an iron template 1 material approximately 10 microns wide, approximately 100 microns long and approximately 1 micron thick on a silicon or silica substrate by traditional sputtering and lift-off techniques. The iron template 1 was then placed in a tubular furnace held at approximately 800° C. into which methane was introduced at a pressure of approximately 1 atm with a flow rate of methane of approximately of 0.1 liters per minute. The iron template 1 was held in the reaction environment (the tubular furnace) for approximately 100 minutes at the furnace temperature. The iron template 1 was then slowly cooled down by gradually withdrawing it from the heated zone or cooling the heated zone of the reactor so that the temperature of the template 1 dropped at a rate of approximately 1° C./sec until the substrate 2 was cooled down to approximately 25° C. During the cooling process an FCS-structure 4 conforming to the shape of the template 1 formed at the template-environment interface.

Also according to example 1, an FCS-structure was produced by preparing a silica template 1 material approximately 10 microns wide, approximately 100 microns long and approximately 1 micron thick on a nickel substrate 2 by traditional silica growth and lift-off techniques. The silica template 1 was then placed in a tubular furnace held at approximately 600° C. into which acetylene and $H_2$ gases in equal amounts were introduced at a pressure of approximately 1 atm with a combined flow rate of the gases of approximately 0.1 liters per minute. The silica template 1 was held in the reaction environment (the tubular furnace) for approximately 20 minutes at the furnace temperature. The silica template 1 was then slowly cooled down by gradually withdrawing it from the heated zone or cooling the heated zone of the reactor so that the temperature of the template 1 dropped at a rate of approximately 1° C./sec until the substrate 2 was cooled down to approximately 25° C. During the cooling process a multi-layered FCS-structure 4 conforming to the shape of the template 1 formed at the template-environment interface.

Example 2 pertains to graphene nanoribbons synthesized from a cementite template 1, according to one embodiment of the invention. In this example, a cementite template 1 is prepared on a substrate 2 by sputtering iron in the desired pattern, for instance in a ribbon, and converting the iron deposit into cementite by exposing the iron deposit to CO gas. The cementite template 1 is then placed in a reaction environment. The conditions inside the reaction environment are then modified by elevating the temperature of the reaction environment such that the carbon in the cementite is released from the template 1 by a chemical reaction causing segregation of the template material. The carbon then migrates onto the surface of the cementite template 1 and begins to self organize in a complete or partial graphene layer with the geometrical bounds of the cementite template 1 thereby determining the geometrical bounds of the graphene layer.

According to example 2 an FCS-structure 4 was produced by preparing an iron template material approximately 10 microns wide, approximately 100 microns long and approximately 1 micron thick on a silicon or silica substrate by traditional sputtering and lift-off techniques. The iron template 1 was then heated in a CO environment in a reaction chamber to approximately 650° C. for approximately 10 minutes to transform the iron template 1 into cementite. The CO gas was then flushed, for example, with argon or nitrogen, or evacuated from the reaction environment. After flushing of the CO the template 1 was heated and held for approximately 1 minute in approximately 750° C. to transform (segregate) the cementite into iron and carbon. During the transformation process an FCS-structure 4 conforming to the shape of the template 1 formed at the template-environment interface.

In the following the meaning for some of the terms used in this document is further clarified.

By a monolayer crystalline surface (MCS) structure is meant a graphene-like crystal having one or more layers largely in parallel to one another. The term FCS-structure (few-layered crystalline surface structure) is meant to include, but not be limited to, layers of two-dimensional crystals of carbon, boron, nitrogen and/or silicon containing sheets, filaments and/or ribbons and/or any other largely two-dimensional crystalline structures, where "few" preferably means a number between 1 . . . 10 layers.

By a template is meant a layer of material which can be used to activate material inside the template for forming crystalline surface structures so that the material self-organizes on the template-environment interface. A property of the template is that it maintains itself as a layer under the synthesis conditions for the crystalline surface structure and does not spontaneously form islands or droplets or otherwise significantly change its topology. In the case of a liquid or molten layer as a template, this implies that the layer is thick enough and the effective wetting angle is small enough such that surface tension does not favor or promote the separation of the layer into individual droplets so as to maintain a long radius of curvature for the surface of the template. The template can comprise, as an example only, transition metals such as iron, nickel or cobalt. Other materials, for instance, nitrides or carbides of transition metals such as cementite are also possible template materials. Such materials have an advantage in that they can withstand higher temperatures before a layer separates into droplets.

By a long radius of curvature is meant that the radius of curvature of the face of the template belonging to the template-environment interface is greater than approximately 30 bond lengths of the crystalline surface structure.

By the template-environment interface is meant the surface of the template which is in contact with the environment, e.g. the reaction environment.

By environment is meant the liquid, gaseous or vacuum environment in contact with the surface of the template.

By activation is meant that a material forming the crystalline surface structure (i.e. the element(s) 3) is released from the bulk of the template and migrates onto the surface of the template on the template-environment interface. The release can be obtained by, for instance, chemical reaction and/or supersaturation.

By a substrate is meant any desired substrate, which is suitable for a specific application. Examples of suitable substrates are numerous. A condition for the substrate used as the substrate for the template is that the substrate must withstand the conditions used for the synthesis of the crystalline surface structure on the template.

As is clear for a person skilled in the art, the invention is not limited to the examples described above but the embodiments can freely vary within the scope of the claims.

The invention claimed is:

1. A method for fabricating crystalline surface structures on a template, the template having a first main planar surface and a second main planar surface opposing the first main surface, the method comprises:
   providing the template on a substrate such that the first main planar surface is completely exposed and the second main planar surface makes contact with the substrate such that the second main planar surface is completely supported by the substrate,
   providing the template positioned on the substrate into a reaction environment, wherein an element required for the formation of the crystalline surface structure is contained within the template,
   heating the template inside the reaction environment to increase mobility of the element within the template, and to increase a surface diffusion length of the element on a template-environment interface,
   homogenously impregnating the template with the element, and
   activating the template by altering conditions within the reaction environment, to make the element migrate towards the template-environment interface and to make the element organize on the surface of the template as a crystalline structure,
   wherein the crystalline structure is a monolayer crystalline surface (MCS) structure or a few-layered crystalline surface (FCS) structure, and
   wherein the element is selected from the group of carbon, nitrogen and boron.

2. The method of claim 1, wherein in that activating the template by altering the conditions within the reaction environment comprises releasing the element from the bulk of the template by a chemical reaction and/or by supersaturation of the template.

3. The method of claim 1, wherein activating the template by altering the conditions within the reaction environment comprises altering the temperature of the template and/or altering the partial pressure of the element in the reaction environment.

4. The method of claim 1, wherein the method further comprises the step of
   impregnating a heated template by the element by introducing the element into the reaction environment in a gas or in a liquid flow over the template, and by letting the element diffuse into the heated template.

5. The method of claim 4, wherein impregnating the heated template comprises introducing the element into the reaction environment as part of one or more precursors which thermally or chemically decompose inside the reaction environment to release the element to be diffused inside the template.

6. The method of claim 4, wherein impregnating the heated template comprises introducing carbon monoxide (CO) precursor into the reaction environment into contact with the template, for making carbon diffuse into the template.

7. The method of claim 1, wherein the crystalline surface structure is graphene.

8. The method of claim 1, wherein the material of the template comprises a transition metal, an oxide, a nitride or a carbide.

9. The method of claim 1, wherein the template is liquid whose surface tension and wetting angle on the substrate are small enough that the liquid template forms a continuous film over the substrate.

10. The method of claim 1, wherein the element is boron.

11. The method of claim 1, wherein the template is manufactured on the substrate.

12. The method of claim 1, wherein the template has a liquid phase within the reaction environment such that surface tension and wetting angle on the substrate are small enough such that the template forms a continuous film over the substrate.

13. The method of claim 1, further comprising transferring the crystalline structure to another substrate.

14. The method of claim 1, further comprising integrating the crystalline structure into an electronic device.

* * * * *